United States Patent
Nagase (10) Patent No.: US 7,512,527 B2
(45) Date of Patent: Mar. 31, 2009

(54) APPARATUS AND METHOD FOR PREPARING DATA TO GENERATE SIMULATION MODEL, AND PROGRAM THEREOF

(75) Inventor: Kenji Nagase, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 364 days.

(21) Appl. No.: 11/391,177

(22) Filed: Mar. 29, 2006

(65) Prior Publication Data
US 2007/0150243 A1    Jun. 28, 2007

(30) Foreign Application Priority Data
Dec. 26, 2005    (JP)    ............... 2005-371335

(51) Int. Cl.
G06F 17/50    (2006.01)
G05B 19/18    (2006.01)

(52) U.S. Cl. ............... 703/2; 703/7; 716/5; 716/16; 702/42

(58) Field of Classification Search ............ 703/2, 703/1, 7, 14; 716/5, 16; 702/42
See application file for complete search history.

(56) References Cited

U.S. PATENT DOCUMENTS 6,080,201 A * 6/2000 Hojat et al. ............ 703/14
6,904,395 B1 6/2005 DeJack et al.
7,228,514 B2 * 6/2007 Chan et al. ............. 716/5
7,284,227 B1 * 10/2007 Roberts et al. .......... 716/16

FOREIGN PATENT DOCUMENTS

| EP | 0 703 538 | 3/1996 |
| JP | 10-034458 | 2/1998 |
| JP | 10-319069 | 12/1998 |

OTHER PUBLICATIONS

German Patent Office Action, mailed Aug. 11, 2006 and issued in corresponding German Patent Application No. 10 2006 014849.5-53.

* cited by examiner

Primary Examiner—Thai Phan
(74) Attorney, Agent, or Firm—Staas & Halsey LLP (57) ABSTRACT

The apparatus for preparing data to generate simulation model extracts the analysis data of the parts required when a simulation is performed based on the CAD data of the parts forming a product to be processed, prepares data as a source of a simulation model of the product by combining the analysis data. The apparatus acquires the central coordinates of fine parts such as a screw, a screw hole, a boss and so on of the parts deleted from the analysis data, assigns a position name to them, and prepares data as a source of a simulation model by combining analysis data based on the position name and central coordinates.

7 Claims, 7 Drawing Sheets

Flame_upper

PART ATTRIBUTE INFORMATION:

```
*Flame_upper           ← PART NAME
#point                 ← COORDINATES OF
1 0.000 0.000 0.000      CONFIGURATION POINT
2 0.000 0.000 0.000
        ·
        ·
#polygon               ← CONFIGURATION SURFACE
1  1  2  3               (POLYGON)
1  2  3  4
        ·
        ·
        ·
        ·
        ·
        ·
#SCREW AAA             ← SCREW INFORMATION
center   0.002  0.002  ← CENTRAL COORDINATES
Pai      0.006         ← DIAMETER
        ·
        ·
```

FIG. 5

Printed_circuit_board

— SCREW HOLE AAA

PART ATTRIBUTE INFORMATION
- *Printed_circuit_board ← PART NAME
- #NET 1 ← NET INFORMATION
  .
  .
- #VCC2.5V ← POWER SUPPLY AREA INFORMATION
  .
  .
- #GND100 ← GROUND AREA INFORMATION
  .
  .
- #SCREW HOLE AAA ← SCREW HOLE INFORMATION
- center  0.001  0.001 ← CENTRAL COORDINATES
- Pai  0.006 ← DIAMETER
  .
  .

APPARATUS AND METHOD FOR PREPARING DATA TO GENERATE SIMULATION MODEL, AND PROGRAM THEREOF

CROSS-REFERENCE TO RELATED APPLICATIONS

This application claims the conventional priority based on Japanese Application No.2005-371335, filed on Dec. 26, 2005, the disclosures of which are incorporated herein by reference.

BACKGROUND OF THE INVENTION

1. Field of the Invention

This invention generally relates to an apparatus and method for preparing data to generate a simulation model and a program thereof, and more particularly to an apparatus and method for preparing data to generate a simulation model which prepare data for use in generating a simulation model of a product required when a simulation is performed for a product to be processed, and a program for preparing data to generate a simulation model for use in realizing the method for preparing data to generate a simulation model.

2. Description of the Related Art

Recently, when a product is designed, a designing process can be supported by performing a simulation in many cases.

Depending on the purpose of a simulation, a simulation can be performed in a part unit, but it may be necessary to perform a simulation on the entire product.

For example, according to the social restrictions on electronic equipment, it is prohibited to discharge unnecessary radio waves or noise exceeding a predetermined level, and various countermeasures such as shielding technology, filtering technology and so on have been devised to satisfy the radio wave standards. In this situation, it is necessary to perform a quantitative simulation about to what extent the technologies can reduce the radio waves.

With the background described above, the applicant of the present invention has disclosed a series of inventions of performing a simulation of the electromagnetic intensity emitted from electronic equipment using method of moment (for example, refer to the patent document 1: Japanese Patent Laid-open No. 10-319069).

When the electromagnetic intensity emitted from electronic equipment is simulated, a simulation model of a printed plate forming part of electronic equipment is incorporated in a simulation model of a housing forming part of the electronic equipment, and a simulation is performed as if actual electronic equipment were present.

Thus, when a product is simulated, a simulation is not performed in a unit of a part (part such as a housing, a printed plate and so on) forming the product, but performed in a condition that the product is formed by putting all parts together.

On the other hand, when a product is simulated, a simulation model corresponding to the purpose of the simulation is generated.

For example, a simulation model corresponding to the simulation is generated by, for example, extracting only metal portions of the parts forming a product, dividing an obtained product model into meshes, and generating a simulation model.

The conventional simulations have been performed mainly in a part unit.

Conventionally, when the entire product performed by putting a plurality of parts together is simulated, a part model is generated by extracting metal portions from the CAD (Computer Aided Design) data of each part, then a simulation operator manually puts the generated part models together, thereby generating a simulation model of the product.

As a simulation of a parts arrangement of a product, the technology of displaying the drawings of the shapes of the hands of an operator for the operation during the assembly of the desired parts on a screen, arranging the drawings near the assembly displayed on the screen, and studying the reservation of the space required for the assembly operation has been disclosed (for example, refer to the patent document 2: Japanese Patent Laid-open No. 10-034458).

As described above, in the conventional technology, when the entire product formed by putting a plurality of parts together is simulated, a part model is generated by extracting metal portions from the CAD data of each part, then a simulation operator manually puts the generated part models, and the simulation model of the product is generated.

A simulation model of a product is generated by, for example, incorporating the printed plate of the product into the housing model of the product as if an actual product were assembled. However, it is a laborious operation to assemble a part model.

That is, a simulation generally requires an enormous computation. Therefore, when a simulation model is generated, a simulation model corresponding to the purpose of the simulation is practically generated, and the portions not directly affecting the simulation are to be simplified, thereby reducing the computation of the simulation.

Since the part model can be simplified for the reason described above, the fine parts such as a screw, a screw hole, a boss and so on are removed in generating a part model.

Thus, when a part model is assembled according to the conventional technology, useful marks for alignment are missing. Therefore, it is necessary to display the part model and perform alignment while checking the alignment process, but it is a very laborious operation.

SUMMARY OF THE INVENTION

The present invention has been developed to solve the above-mentioned problems, and it is an object of the present invention to provide an apparatus for preparing data to generate a simulation model which makes it possible to largely shorten a time to generate a necessary simulation model of a product when the simulation is performed on the product as a processing object.

It is another object of the present invention to provide a method for preparing data to generate a simulation model which makes it possible to largely shorten a time to generate a necessary simulation model of a product when the simulation is performed on the product as a processing object.

It is still another object of the present invention to provide a program for preparing data to generate a simulation model which makes it possible to largely shorten a time to generate a necessary simulation model of a product when the simulation is performed on the product as a processing object.

An apparatus for preparing data to generate a simulation model according to the present invention prepares data for use in generating a simulation model of a product required in performing a simulation of a product to be processed. The apparatus comprises an extraction unit extracting analysis data of parts required when a simulation is performed based on CAD (Computer Aided Design) data of parts forming the product to be processed, an acquisition unit acquiring central coordinates of a coupling portion for coupling parts not included in the analysis data based on the CAD data, an assignment unit assigning a position name to the central coordinates acquired by the acquisition unit, and a preparation unit preparing composite data of the analysis data as a source of a simulation model of the product to be processed by combining the analysis data extracted by the extraction unit based on the position name and the central coordinates.

With the above-mentioned configuration, the acquisition unit can acquire coordinates of the position specified by a user as the central coordinates of the coupling portion for coupling parts.

A method for preparing data to generate a simulation model according to the present invention prepares data for use in generating a simulation model of a product required in performing a simulation for a product to be processed. The method comprises extracting analysis data of parts required when the simulation is performed based on CAD data of parts forming the product to be processed, acquiring central coordinates of a coupling portion for coupling parts not included in the analysis data based on the CAD data, assigning a position name to the acquired central coordinates, and preparing composite data of analysis data as a source of a simulation model of the product to be processed by combining the extracted analysis data based on the position name and the central coordinates.

Each of the above-mentioned process unit can also be realized by a computer program, and the computer program is provided by being recorded on a computer-readable recording medium or provided over a network, and then installed and operated by control means of the CPU and so on when the present invention is embodied, thereby realizing the present invention.

The apparatus for preparing data to generate a simulation model with the above-mentioned configuration extracts the analysis data of the parts required in performing a simulation based on the CAD data of the parts forming a product to be processed, acquires the central coordinates of the coupling portion for coupling the parts not included in the extracted analysis data based on the CAD data of the parts. For example, the apparatus acquires the central coordinates of a screw and a screw hole prepared for coupling the parts as the central coordinates of the coupling portions for coupling the parts, and acquires the coordinates of a user-specified position.

Then, the apparatus assigns the position name to the acquired central coordinates. For example, the apparatus assigns a position name to the central coordinates based on the information about the screw number acquired from the CAD data and a set instruction from a user such that the position name of the central coordinates of a coupling destination can be indicated.

Next, the apparatus prepares the composite data of the analysis data as the source of a simulation model of a product to be processed by combining the extracted analysis data based on the assigned position name and the acquired central coordinates.

Thus, the apparatus for preparing data to generate a simulation model according to the present invention extracts the analysis data of the parts required when a simulation is performed based on the CAD data of the parts forming a product to be processed, and prepares data as a source of a simulation model of the product by combining the analysis data. The apparatus acquires the central coordinates of a fine parts such as a screw, a screw hole, a boss and so on of a part deleted from the analysis data, assigns a position name to them, and prepares the data as a source of the simulation model by combining analysis data based on the position name and the central coordinates.

According to the present invention, when data is prepared for use in generating a simulation model of a product required in a case a simulation is performed on a product to be processed, the data can be prepared in a very short time by automatically coupling parts. Therefore, a simulation model of the product can be generated in a very short time.

DETAILED DESCRIPTION OF THE PREFERRED EMBODIMENTS

The present invention is described in detail according to an embodiment of the present invention.

Figure 1:
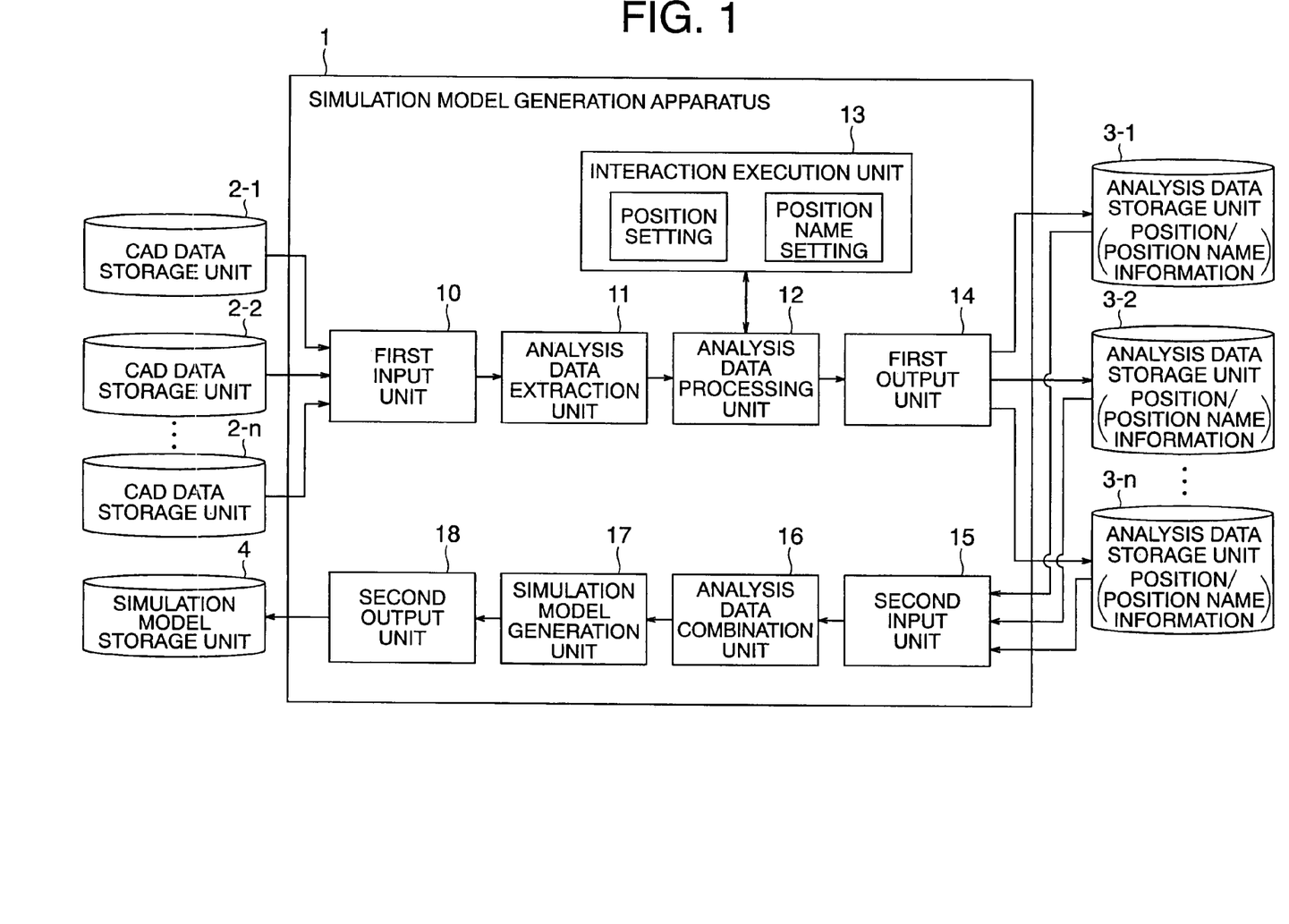
FIG. 1 shows an embodiment of the simulation model generation apparatus according to the present invention.

FIG. 1 shows an embodiment of a simulation model generation apparatus 1 according to the present invention.

The simulation model generation apparatus 1 according to the present invention is an apparatus for preparing data to generate a simulation model, and performs a process of generating a simulation model of a product required when a simulation is performed on a product to be processed. As shown in FIG. 1, the apparatus includes a first input unit 10, an analysis data extraction unit 11, an analysis data processing unit 12, an interaction execution unit 13, a first output unit 14, a second input unit 15, an analysis data combination unit 16, a simulation model generation unit 17, and a second output unit 18.

The first input unit 10 performs the process of inputting the CAD data of a plurality of parts forming a product to be processed from a CAD data storage unit 2-$i$ ($i$=1 to n) which stores the CAD data of the parts.

The analysis data extraction unit 11 performs the process of extracting analysis data of the parts required when a simulation is performed based on the CAD data of the parts input by the first input unit 10.

The analysis data processing unit 12 performs the processes of acquiring central coordinates of the coupling portions for coupling the parts not included in the analysis data extracted by the analysis data extraction unit 11 based on the CAD data of the parts input by the first input unit 10, setting the central coordinates other than the central coordinates of the portions according to an instruction from the interaction execution unit 13, and assigning the position names to the central coordinates according to an instruction from the interaction execution unit 13.

The interaction execution unit 13 performs the processes of setting the central coordinates other than the central coordinates automatically acquired by the analysis data extraction unit 11 by interacting with a user through an input/output terminal not shown in FIG. 1, notifying the analysis data processing unit 12 of the setting information, setting the position name assigned to the central coordinates automatically acquired by the analysis data extraction unit 11 and the central coordinates set by the pertinent execution unit, and notifying the analysis data processing unit 12 of the setting information.

The first output unit 14 performs the process of storing the analysis data which is extracted by the analysis data extraction unit 11 and to which the central coordinates and the position name are added by the analysis data processing unit 12 in an analysis data storage unit 3-$i$ ($i$=1 to n) provided as associated with the CAD data storage unit 2-$i$.

The second input unit 15 performs the process of inputting analysis data of a plurality of parts forming a product to be processed from the analysis data storage unit 3-$i$.

The analysis data combination unit 16 performs the process of preparing composite data of analysis data as a source of a simulation model of a product to be processed by combining the analysis data input by the second input unit 15.

The simulation model generation unit 17 performs the process of generating a simulation model of a product to be processed based on the composite data of the analysis data prepared by the analysis data combination unit 16.

The second output unit 18 performs the process of storing a simulation model generated by the simulation model generation unit 17 in a simulation model storage unit 4.

Figure 2:
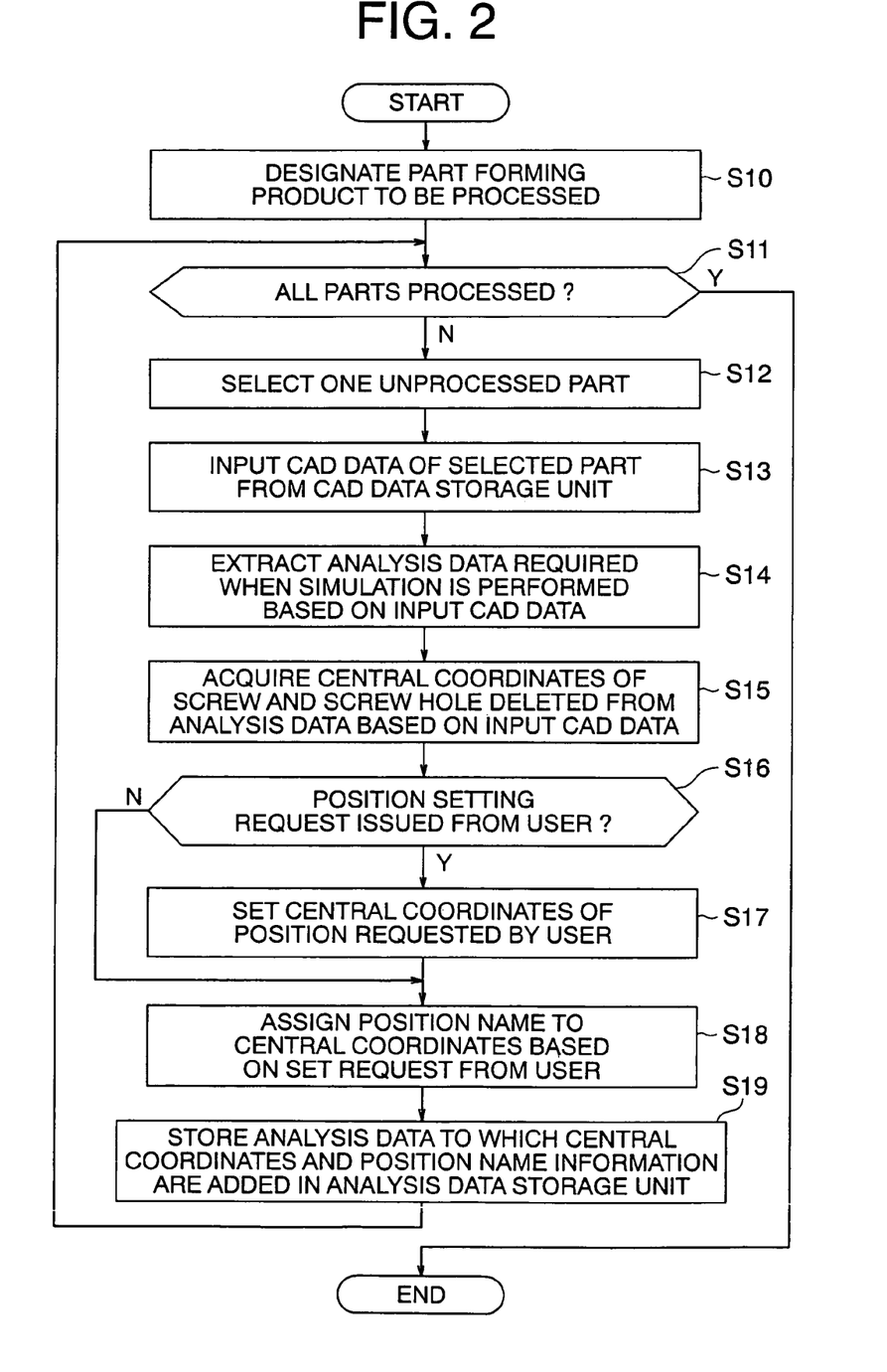
FIGS. 2 and 3 are process flowcharts of the simulation model generation apparatus according to the present invention.
Figure 3:
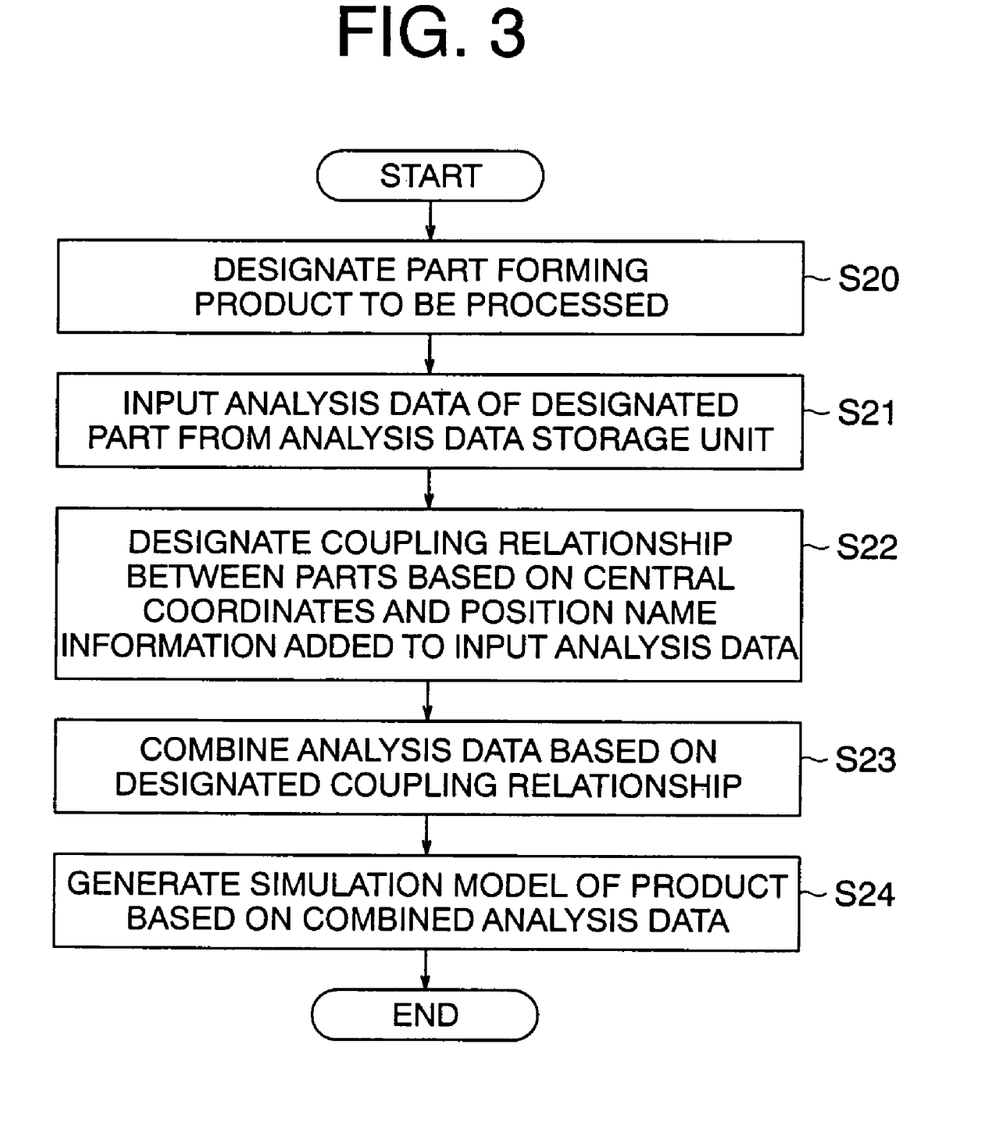

FIGS. 2 and 3 show an example of a flow of a process performed by the simulation model generation apparatus 1 according to the present invention.

According to the process flow, the process performed by the simulation model generation apparatus 1 according to the present invention having a configuration shown in FIG. 1 is described below in detail.

The simulation model generation apparatus 1 according to the present invention designates part (or a plurality of parts) forming a product to be processed at first by referring to the database not shown for managing the information about what parts form each product in the step S10 as shown in the process flow shown in FIG. 2 when a request is issued to prepare the analysis data by specifying a product to be processed. That is, when the product to be processed is electronic equipment, a part of a housing forming part of the electronic equipment, a printed plate implemented in the housing and so on is designated.

Then, in the step S11, it is determined whether or not the process has been performed on all designated parts. When it is determined that the process has not been performed on all parts, then control is passed to the step S12, and one unprocessed part is selected.

Then, in the step S13, the CAD data of the selected part is input from the CAD data storage unit 2-$i$. Then, in the step S14, the analysis data required when a simulation is performed is extracted by extracting, for example, only a metal portion based on the input CAD data. Then, in the step S15, the central coordinates of a screw and a screw hole prepared for coupling the parts deleted from the analysis data are acquired based on the input CAD data.

Then, in the step S16, it is determined whether or not there is a request from a user to set a position other than the central coordinates of a screw or a screw hole automatically acquired from the CAD data. When it is determined there is a request to set a position from a user, control is passed to the step S17, and the central coordinates of the position of the set request is set.

In the step S18, according to a set request from a user, a position name is assigned to the central coordinates acquired in the step S15 and the central coordinates set in the step S17 such that the central coordinates of the coupling partners can be indicated.

For example, the four central coordinates of the part A are expressed by $(x_{A1}, y_{A1})$, $(x_{A2}, y_{A2})$, $(x_{A3}, y_{A3})$, and $(x_{A4}, y_{A4})$, the two central coordinates of the part B are expressed by $(x_{B1}, y_{B1})$ and $(x_{B2}, y_{B2})$, and the two central coordinates of the part C are expressed by $(x_{C1}, y_{C1})$ and $(x_{C2}, y_{C2})$. When the parts A and B are coupled by coupling them at the positions of $(x_{A1}, y_{A1})$ and $(x_{A1}, y_{B1})$, and $(x_{A2}, y_{A2})$ and $(x_{32}, y_{B2})$, and when the parts A and C are coupled by coupling them at the positions of $(x_{A3}, y_{A3})$ and $(x_{C1}, y_{C1})$, and $(x_{A4}, y_{A4})$ and $(x_{C2}, y_{C2})$, for example, the position names are assigned to the central coordinates acquired in the step S15 and the central coordinates set in the step S17 as follows such that the central coordinates of the coupling partners can be indicated.

the position name "A1B1" is assigned to the central coordinates $(x_{A1}, y_{A1})$.
the position name "A2B2" is assigned to the central coordinates $(x_{A2}, y_{A2})$.
the position name "A3C1" is assigned to the central coordinates $(x_{A3}, y_{A3})$.
the position name "A4C2" is assigned to the central coordinates $(x_{A4}, y_{A4})$.
the position name "A1B1" is assigned to the central coordinates $(X_{B1}, y_{B1})$.
the position name "A2B2" is assigned to the central coordinates $(x_{B2}, y_{B2})$.
the position name "A3C1" is assigned to the central coordinates $(x_{C1}, y_{C1})$.
the position name "A4C2" is assigned to the central coordinates $(x_{C2}, y_{C2})$.

Then, in the step S19, the analysis data to which the central coordinates and the position name information are added is stored in the analysis data storage unit 3-$i$, and control is returned to the step S11 to perform the process on the subsequent part.

Then, when it is determined in the step S11 that the process has been completed on all parts forming a product to be processed by repeating the processes in the steps S11 to S19, then the process terminates.

Thus, the simulation model generation apparatus 1 according to the present invention performs the process flow shown in FIG. 2, extracts the analysis data of the parts required in performing a simulation on the parts forming a product to be processed, acquires the central coordinates of a screw and a screw hole prepared for coupling the parts deleted from the analysis data, sets the central coordinates by responding the set instruction from a user as necessary, and assigns a position name to the central coordinates such that the central coordinates of the coupling partner can be indicated, thereby adding the central coordinates and the position name information to the extracted analysis data and storing the data in the analysis data storage unit 3-$i$.

On the other hand, when there is a request to generate a simulation model with a product to be processed specified, the simulation model generation apparatus 1 according to the present invention designates the parts forming a product to be processed at first by referring to the database not shown for managing the information about what parts form each product in the step 20 as shown in the process flow in FIG. 3. That is, when a product to be processed is an electronic equipment, parts of a housing forming part of the electronic equipment, a printed plate implemented in the housing and so on are designated.

Then, in the step S21, the analysis data storage unit 3-$i$ inputs the analysis data of all designated parts.

In the step S22, the coupling relationship between the parts is designated based on the central coordinates and the position name information added to the input analysis data.

For example, when the explanation is given by referring to the above-mentioned example, the coupling relationship that the central coordinates $(x_{A1}, y_{A1})$ of the part A are to be coupled to the central coordinates $(x_{B1}, y_{B1})$ of the part B is designated by having the same position name A1B1, the coupling relationship that the central coordinates $(x_{A2}, y_{A2})$ of the part A are to be coupled to the central coordinates $(x_{B2}, y_{B2})$ of the part B is designated by having the same position name A2B2, the coupling relationship that the central coordinates $(x_{A3}, y_{A3})$ of the part A are to be coupled to the central coordinates $(x_{C1}, y_{C1})$ of the part C is designated by having the same position name A3C1, and the coupling relationship that the central coordinates $(x_{A4}, y_{A4})$ of the part A are to be coupled to the central coordinates $(x_{C2}, y_{C2})$ of the part C is designated by having the same position name A4C2.

Then, in step S23, the input analysis data are combined based on the designated coupling relationships.

For example, when the explanation is given by referring to the above-mentioned example, based on the coupling relationships that the central coordinates $(x_{A1}, y_{A1})$ of the part A are to be coupled to the central coordinates $(x_{B1}, y_{B1})$ of the part B, and the central coordinates $(x_{A2}, y_{A2})$ of the part A are to be coupled to the $(x_{B2}, y_{B2})$ of the part B, the analysis data of the part A is combined with the analysis data of the part B, and based on the coupling relationships that the central coordinates $(x_{A3}, y_{A3})$ of the part A are to be coupled to the central coordinates $(x_{C1}, y_{C1})$ of the part C, and the central coordinates $(x_{A4}, y_{A4})$ of the part A are to be coupled to the $(x_{C2}, y_{C2})$ of the part C, the analysis data of the part A is combined with the analysis data of the part B.

Then, in the step S24, based on the combined analysis data, a simulation model of a product to be processed is generated, and is stored in the simulation model storage unit 4, thereby terminating the process.

For example, by dividing the combined analysis data into meshes, a simulation model of a product to be processed is generated and stored in the simulation model storage unit 4, thereby terminating the process.

Thus, the simulation model generation apparatus 1 according to the present invention performs the process flow shown in FIG. 3, thereby automatically combining the analysis data based on the central coordinates and the position name information added to the analysis data, and generating a simulation model of a product to be processed according to the combined analysis data.

Figure 4:
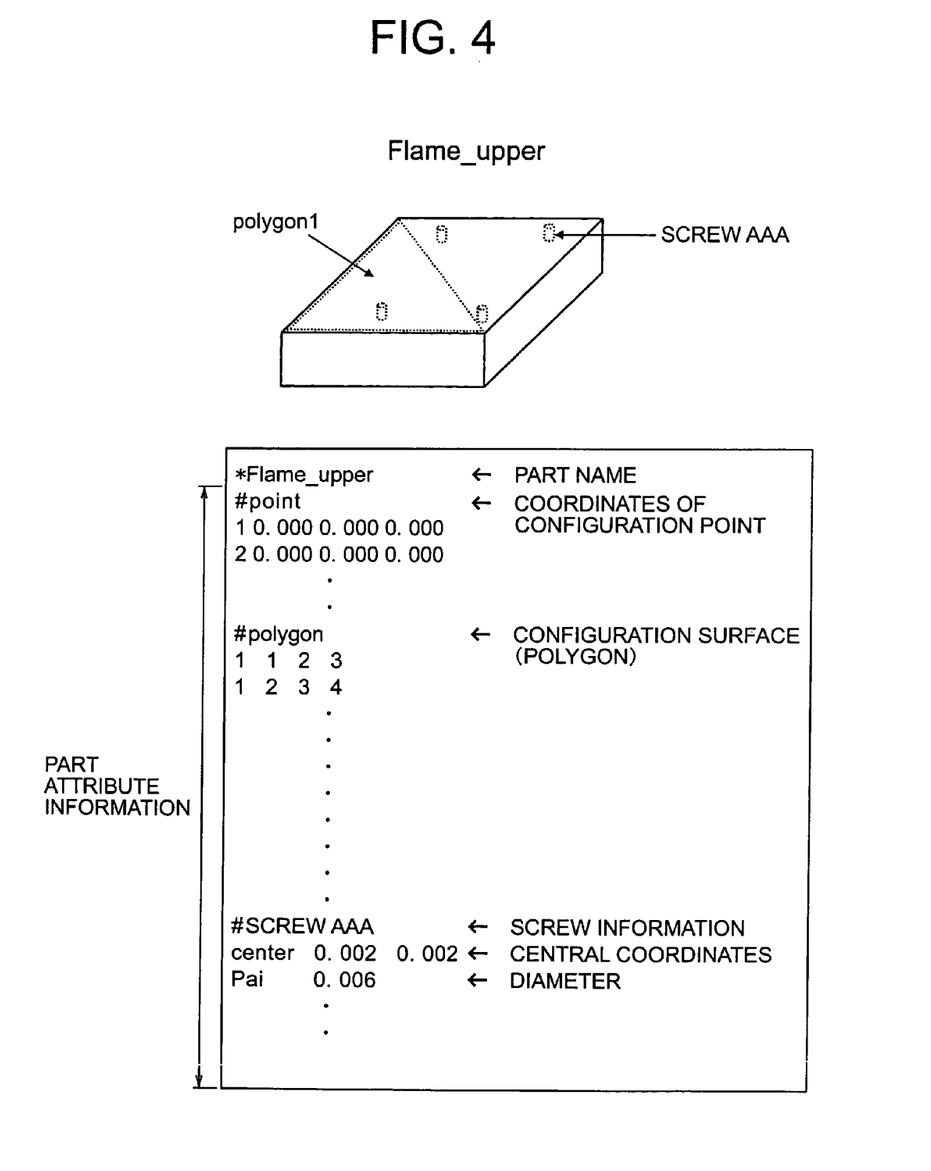
FIG. 4 is an explanatory view of the CAD data of a frame part.
Figure 5:
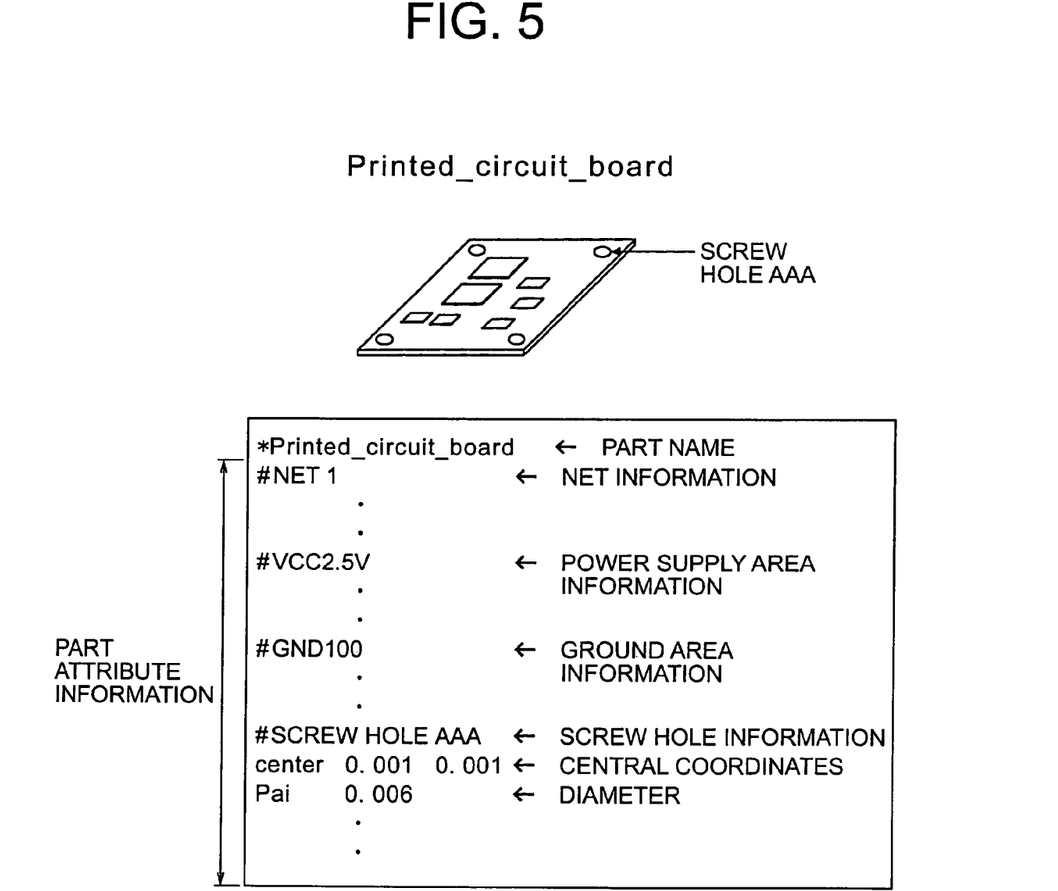
FIG. 5 is an explanatory view of the CAD data of a printed plate part.
Figure 6:
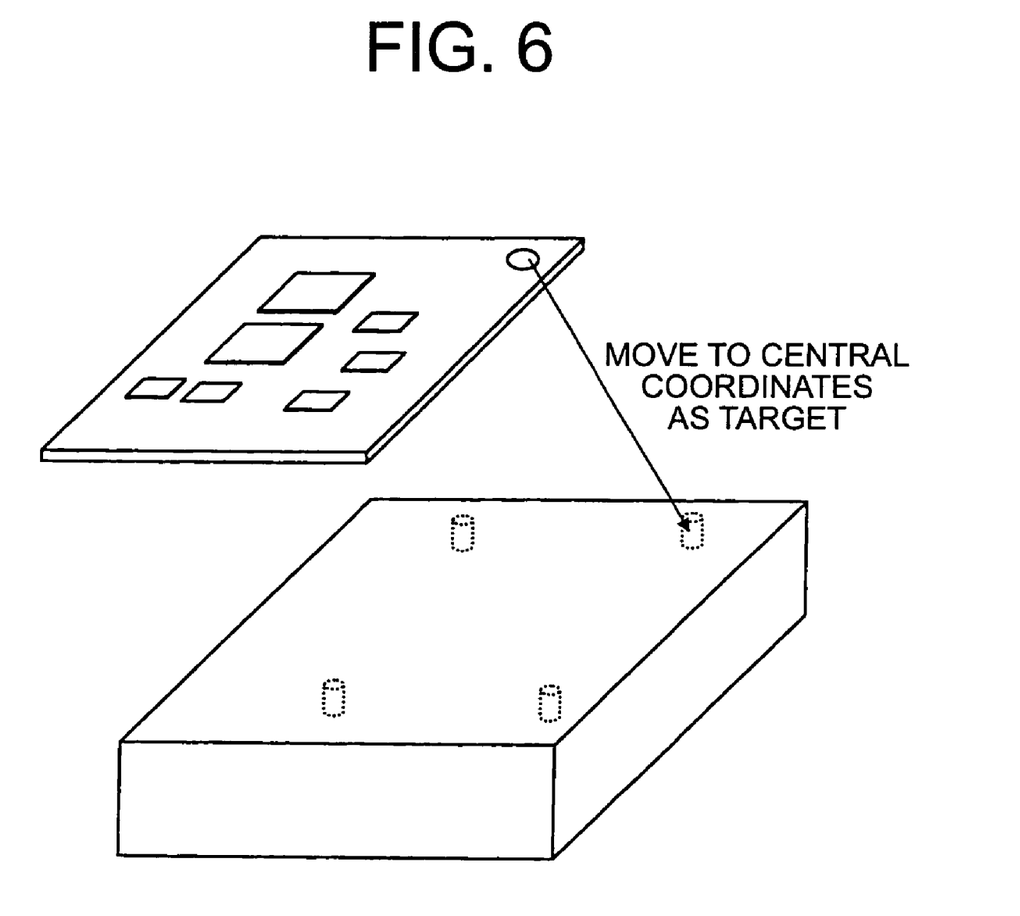
FIGS. 6 and 7 are explanatory views of the process performed by the simulation model generation apparatus according to the present invention.

Next, by referring to FIGS. 4 to 6, the processes performed by the simulation model generation apparatus 1 according to the present invention are concretely explained.

FIG. 4 shows an example of the CAD data of the frame part to which the printed plate is attached. FIG. 5 shows an example of the CAD data of the parts of the printed plate to be attached to the frame parts.

As shown in FIG. 4, for the CAD data of the part having the three-dimensional structure such as a frame part, the structure is described by dividing the part into polygons formed by triangles. When the part includes a screw and a screw hole, their attribute information is also described. In the example shown in FIG. 4, it is assumed that a screw AAA is provided, and the central coordinates about the screw position and the diameter of the screw are described as the attribute information.

Furthermore, as shown in FIG. 5, for the CAD data of the part having the two-dimensional structure such as a printed plate, the structure is described without dividing the part into polygons formed by triangles. When the part includes a screw and a screw hole, their attribute information is also described. In the example shown in FIG. 5, it is assumed that a screw hole AAA is provided, and the central coordinates about the screw hole position and the diameter of the screw hole are described as the attribute information.

In a case the screw of the frame part is to be coupled to the screw hole of the printed plate part, the simulation model generation apparatus 1 according to the present invention acquires the central coordinates of the screw and the central coordinates of the screw hole to be deleted when analysis data as a source for generation of a simulation model is prepared based on the CAD data, and assigns a position name to the central coordinates such that the central coordinates of the coupling partner can be indicated by interfacing with a user or based on an identification information about a screw and a screw hole described in the CAD data, thereby automatically realizes the coupling when a simulation model is generated as shown in FIG. 6.

Figure 7:
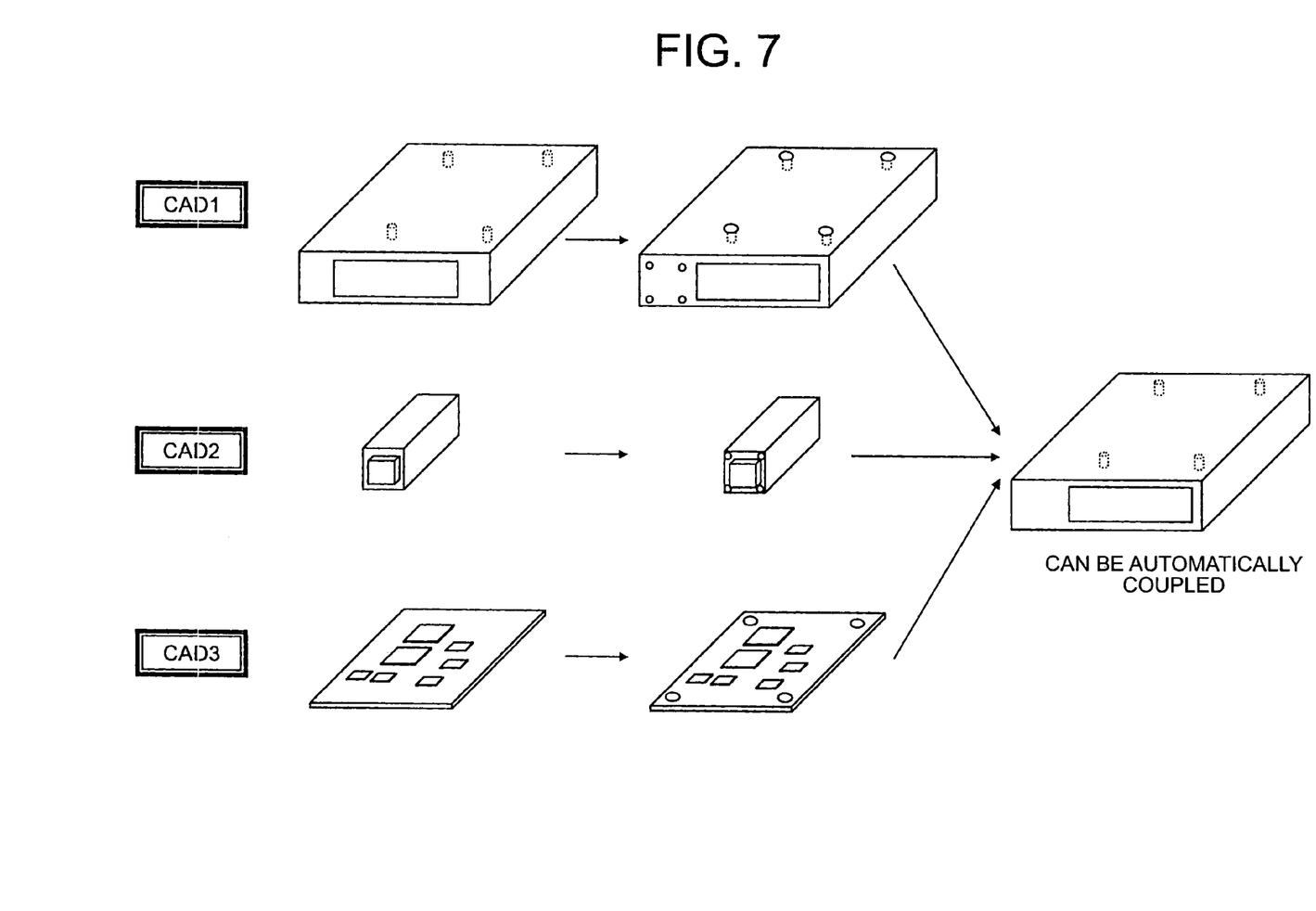

Thus, with the simulation model generation apparatus 1 according to the present invention, when a simulation model of a product formed by a plurality of parts is generated, the parts are automatically coupled as shown in FIG. 7. Therefore, the data can be prepared in a very short time, and a simulation model of the product can be generated in a very short time.

The present invention is used in generating a simulation model of a product required when a simulation is performed for the product formed by assembling a plurality of parts, and realizes the generation of a simulation model of the product in a very short time.

What is claimed is:

1. An apparatus for preparing data to generate a simulation model which prepares data for use in generating a simulation model of a product required in performing a simulation of a product to be processed, the apparatus comprising:
    an extraction unit extracting analysis data of two parts required when the simulation is performed based on CAD (Computer Aided Design) data, the two parts forming the product to be processed;
    an acquisition unit acquiring central coordinates of coupling portions of the two parts based on the CAD data, the central coordinates not included in the analysis data, and the coupling portions of the two parts coupled with each other;
    an assignment unit assigning a position name to each of the central coordinates of the coupling portions of the two parts, the position name indicating parts to be coupled; and
    a preparation unit preparing composite data of the analysis data of the two parts as a source of a simulation model of the product to be processed by combining the analysis data of the two parts based on the position name and the central coordinates, each of the two parts having the central coordinates assigned the position name indicating the other of the two parts.

2. The apparatus according to claim 1, wherein the acquisition unit acquires coordinates of a position specified by a user as the central coordinates of the coupling portion.

3. The apparatus according to claim 1, wherein the acquisition unit acquires central coordinates of a screw and central coordinates of a screw hole as the central coordinates of the coupling portion.

4. The apparatus according to claims 1, wherein the assignment unit assigns a position name to a central coordinates such that the position name of the central coordinates of a coupling destination can be indicated.

5. A method for preparing data to generate a simulation model which prepares data for use in generating a simulation model of a product required in performing a simulation for a product to be processed, comprising:
   extracting analysis data of two parts required when the simulation is performed based on CAD data, the two parts forming the product to be processed;
   acquiring central coordinates of coupling portions of the two parts based on the CAD data, the central coordinates not included in the analysis data, and the coupling portions of the two parts coupled with each other;
   assigning a position name to each of the central coordinates of the coupling portions of the two parts, the position name indicating parts to be coupled; and
   preparing composite data of analysis data of the two parts as a source of a simulation model of the product to be processed by combining the analysis data of the two parts based on the position name and the central coordinates, each of the two parts having the central coordinates assigned the position name indicating the other of the two parts.

6. A program for preparing data to generate a simulation model used to prepare data for use in generating a simulation model of a product required in performing a simulation for a product to be processed, the program causing a computer to execute:
   extracting analysis data of two parts required when the simulation is performed based on CAD data, the two parts forming the product to be processed;
   acquiring central coordinates coupling portions of the two parts based on the CAD data, the central coordinates not included in the analysis data, and the coupling portions of the two parts coupled with each other;
   assigning a position name to each of the central coordinates of the coupling portions of the two parts, the position name indicating parts to be coupled; and
   preparing composite data of analysis data of the two parts as a source of a simulation model of the product to be processed by combining the analysis data of the two parts based on the position name and the central coordinates, each of the two pads having the central coordinates assigned the position name indicating the other of the two parts.

7. A method of simulating coupling parts and corresponding coupling holes in assembly of a product, comprising:
   extracting coupling part data for each coupling part of a plurality of coupling parts typically discarded in a CAD design;
   determining central coordinates of a pair of coupling holes, each coupling hole corresponding to one of the coupling parts; and
   assigning a position name to the central coordinates, the position name indicating a coupling part and coupling hole pair.

* * * * *

UNITED STATES PATENT AND TRADEMARK OFFICE
CERTIFICATE OF CORRECTION

PATENT NO.        : 7,512,527 B2                                       Page 1 of 1
APPLICATION NO. : 11/391177
DATED             : March 31, 2009
INVENTOR(S)       : Kenji Nagase It is certified that error appears in the above-identified patent and that said Letters Patent is hereby corrected as shown below:

Column 8, Line 64 Claim 4, change "claims 1," to --claim 1,--.

Column 10, Line 1 Claim 6, after "coordinates" insert --of--.

Column 10, Line 12 Claim 6, change "pads" to --parts--.

Signed and Sealed this

Thirtieth Day of June, 2009

JOHN DOLL
*Acting Director of the United States Patent and Trademark Office*